United States Patent [19]

Leitl

[11] Patent Number: 4,949,055
[45] Date of Patent: Aug. 14, 1990

[54] CRYSTAL OSCILLATOR COMPENSATION CIRCUIT

[76] Inventor: Franz Leitl, Luisenstrasse 3, D-7100 Heilbronn, Fed. Rep. of Germany

[21] Appl. No.: 334,107
[22] PCT Filed: Aug. 28, 1987
[86] PCT No.: PCT/DE87/00382
  § 371 Date: Feb. 10, 1989
  § 102(e) Date: Feb. 10, 1989
[87] PCT Pub. No.: WO88/01810
  PCT Pub. Date: Mar. 10, 1988

[30] Foreign Application Priority Data

Aug. 30, 1986 [DE] Fed. Rep. of Germany ....... 3629588

[51] Int. Cl.⁵ ................................................ H03B 5/32
[52] U.S. Cl. ..................................... 331/158; 331/176
[58] Field of Search ................. 331/116 FE, 158, 175, 331/176; 368/159

[56] References Cited

U.S. PATENT DOCUMENTS 4,318,063 3/1982 Przyjemski ........................... 331/158

FOREIGN PATENT DOCUMENTS 2469823 5/1981 France .
0141556 12/1978 Japan .................................. 331/158
2064248 6/1981 United Kingdom .
2095005 9/1982 United Kingdom .

Primary Examiner—Robert J. Pascal
Attorney, Agent, or Firm—Connolly & Hutz

[57] ABSTRACT

A crystal oscillator compensation circuit (13) has an oscillator crystal (12) excited by a piezoelectric oscillator circuit (19), whereby the frequency (f) can be shifted in certain limits by means of a variable-capacity diode (14). The crystal temperature is measured by a temperature sensor (17) which retransmits a temperature signal by means of an analog/digital converter (22) to a microprocessor with a bus (24), and input/output port (15), a PROM (16) and a logic circuit (18). This microprocessor calculates, on the basis of the temperature signal allowing for a known regularity and characteristic numbers stored in the PROM memory for the crystal concerned, a temperature compensation signal which is transmitted by means of a D/A converter (21) to the variable-capacity diode. The temperature compensation signal ($U_K$) has a value such that the effect which it creates on the frequency of the piezoelectric oscillator compensates exactly for the effect on the frequency produced by the measured temperature variation. Such a crystal oscillator compensation circuit is much less costly and requires far less room than a corresponding conventional circuit of identical accuracy, which called for thermostats adjusted with a very high degree of precision. Other compensation circuits serve to compensate for the effects of ageing or acceleration.

10 Claims, 5 Drawing Sheets

$$\frac{\Delta f}{f} = K_a(T-T_0) + K_b(T-T_0)^3$$

CRYSTAL OSCILLATOR COMPENSATION CIRCUIT

DESCRIPTION

1. Technical Field

The invention relates to a crystal oscillator compensation circuit comprising an oscillator crystal, briefly called crystal hereinafter, which is excited into oscillation by a crystal oscillator circuit, and an adjustable capacitance for adjusting the frequency of the oscillator.

2. Prior Art

Once a crystal oscillates at a particular frequency due to predetermined dimensions, a predetermined direction of cut and a predetermined control voltage across the adjustable capacitance, this frequency will only be held for a certain temperature and only for a certain time.

To compensate for effects which change the frequency, various compensation circuits have become known.

From GB-A-2 095 005, a crystal oscillator compensation circuit is known, comprising an oscillator crystal which is excited into oscillation by a crystal oscillator circuit, and with an adjustable capacitance for adjusting the frequency of the crystal. This is a crystal oscillating at a relatively low frequency such as is used in clocks. To compensate for the effect of aging of the crystal on the frequency, a reference oscillator circuit comprising a quartz crystal oscillating at a high frequency (for example AT cut) is also provided. The lower frequency is continuously compared with a partvalue of the high frequency, if deviations are found, the frequency of the oscillator crystal is changed by the adjustable capacitance in such a manner that the measured difference becomes zero.

The said circuit only functions if the reference quartz crystal does not age significantly. To achieve this, such a reference crystal must be artificially aged at relatively high temperatures. To keep aging effects of crystals oscillating at a high frequency as low as possible, it is known to age crystals for a relatively long time, for example for some months, at 80 to 90 degrees Celsius. The crystal properties change only little with the course of time after such a treatment.

A circuit for compensating temperature effects instead of aging effects is known from GB-A- 2 064 248. The circuit also exhibits an oscillator crystal and an adjustable capacitance for adjusting the frequency of the crystal. In addition, there is a store in which, for a large number of different temperatures, compensation values are recorded which have been determined for each individual crystal in a calibration process in such a manner that the frequency remained unchanged when they were applied. Such a calibration process is extremely time consuming since it is necessary to wait for thermal equilibrium for each of the many calibration steps.

A circuit for compensating acceleration effects is known from US-A-4 318 063. Apart from the oscillator crystal and the adjustable capacitance for adjusting the frequency of the crystal, this exhibits an acceleration sensor and a logic circuit which, in accordance with a known law relating to the relationship between acceleration and frequency change, calculates a compensation value which is intended to cancel the frequency change occurring during the measured acceleration. The same equation is used for all crystals, that is to say no calibration for each individual crystal is performed as in the circuit for temperature compensation described above.

The above shows clearly that a reliable compensation circuit is lacking, particularly with respect to aging effects. As described, the known compensation circuit is only capable of compensating for aging effects of a slowly oscillating crystal within the extent of those aging effects to which a rapidly oscillating crystal is subject. It is accordingly not possible to compensate for aging effects of the rapidly oscillating crystal.

The invention is based on the object of specifying a crystal oscillator compensation circuit which is capable of reliably compensating for aging effects.

REPRESENTATION OF THE INVENTION

The circuit according to the invention exhibits, like known circuits, an oscillator crystal which is excited into oscillation by a crystal oscillator circuit and a frequency of which can be adjusted by an adjustable capacitance. In addition, the circuit exhibits a port for connecting a measuring instrument for measuring characteristics of the crystal and a store for storing characteristic numbers of the crystal which have been calculated from the measurement data. These features make it possible to store crystal-individual data, namely physical characteristics for the crystal, from which compensation values can be calculated in accordance with a formula. Thus, the store is not used for storing a large number of individual compensation values. To be able to detect the temperature-dependent behavior of the aging, the compensation circuit also exhibits an aging circuit. The signal from this circuit and the characteristic numbers of the crystal together are used by a logic circuit for calculating a compensation signal which is changed between a first time and a second time by such an amount that the resultant influence for shifting the oscillator frequency just cancels the influence for the opposite shift which is due to the aging between the two times. The signal from the aging circuit is obtained because it contains a counter and an oscillator circuit, the counter counting oscillations of the circuit. The circuit exhibits a temperature-dependent component the frequency of which changes with the temperature in accordance with an exponential law.

If a crystal with such a compensation circuit is used in a stationary temperature control device, no further compensations are required. If, in contrast, the crystal is exposed to temperature changes and possibly also accelerations, it is of advantage, in accordance with advantageous further developments, to perform a temperature and/or an acceleration compensation in addition to the aging compensation. For these compensations, too, it is of advantage that the port for connecting a measuring instrument for measuring characteristics of the crystal and the store for storing characteristic numbers calculated from the measurement data exists. Thus, crystal-individual characteristic numbers can also be determined for the temperature and/or the acceleration compensation and recorded in the store. In these cases, therefore, it is not that a large number of individually calibrated values is stored but that characteristic numbers are calculated from a few measured values on the basis of predetermined physical laws and these are later used again so that compensation values can be calculated from the known physical formulae when a temperature change and/or an acceleration change is found.

According to an advantageous further development, an oscillator circuit within the aging circuit exhibits an oscillator transistor between the base and collector of which the crystal, a decoupling capacitor and the capacitance diode are connected in the said order. In this arrangement, the supply voltage is present at the collector and the control voltage obtained from the supply voltage, taking into consideration the compensation signals, for the capacitance diode is supplied between the latter and the decoupling capacitor. The capacitance diode is thus located between two voltages which are referred to a single voltage which, in addition, is scarcely temperature-dependent. Thus only the temperature response of the crystal must be compensated but not also a temperature response of the exciting circuit.

Further advantages and effects of the invention and other advantageous further developments and embodiments are explained in greater detail with reference to figures in the text which follows.

PREFERRED EMBODIMENT OF THE INVENTION

The preferred embodiment of the invention, which is explained in greater detail below with reference to FIGS. 4 to 6 and 9, is based on laws of the behavior of oscillating crystals which will now be described in greater detail with reference to FIGS. 1 to 3.

Figure 1:
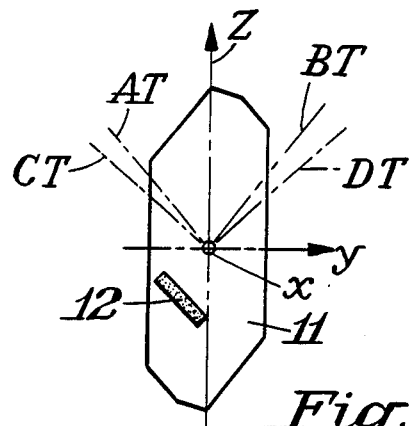
FIG. 1 is a diagrammatic representation for explaining the directions of cut of oscillator crystals from a quartz monocrystal.

In the section according to FIG. 1 through a quartz monocrystal 11 in the y-z plane, directions of normally used cuts are given, particular reference being made here to the AT cut. Conventional oscillating crystals 12 are cut in the form of cube-shaped rods from the quartz monocrystal 11 approximately parallel to this direction AT. The frequency at which such crystals are operated fluctuates within wide limits, crystals in the range between 1-20 MHz being used most frequently. Crystals with 5 MHz or 10 MHz are normal. Other frequencies are obtained, as a rule, by dividing the said frequencies.

Figure 2:
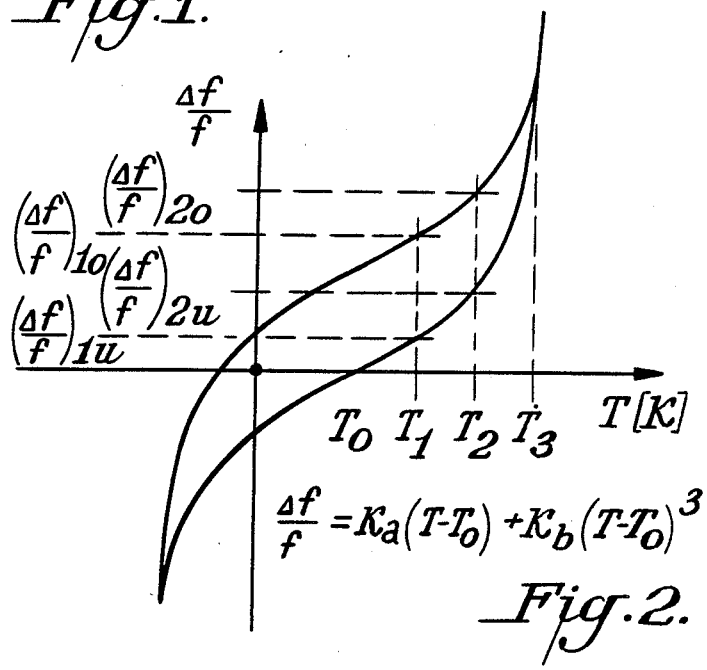
FIG. 2 is a diagram for explaining the temperaturedependent frequency response of an oscillator crystal
Figure 3:
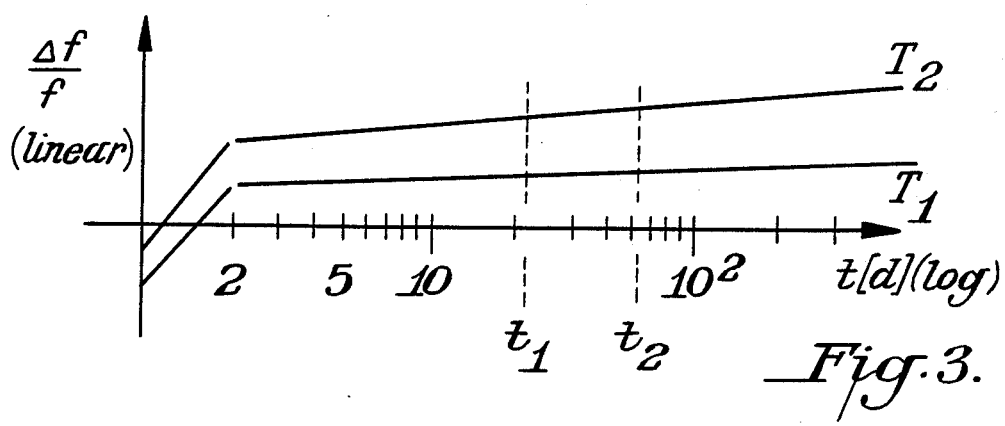
FIG. 3 is the diagram of the aging-dependent frequency response of an oscillating crystal.

The frequency of resonance (or the frequency of anti-resonance) of a crystal oscillator is temperature dependent, which is shown in FIG. 2, time dependent, which is shown in FIG. 3 and acceleration dependent, which is not shown in greater detail since this effect is of subordinate significance as a rule.

The frequency response in dependence on temperature satisfies certain laws. In the case of a crystal with AT direction of cut, the law is a cubic parabolic for which the following holds true:

$$\Delta f/f = k_a(T-T_o) + k_b(T-T_o)^3$$

where f is the frequency of oscillation, T is the temperature of the crystal and $k_a$, $k_b$ and $T_o$ are constants which must be individually determined for each crystal and depend, in particular, on the deviation of the cut direction from the AT direction.

FIG. 2 also shows that the said frequency response is subject to a hysteresis effect which, however, is drawn exaggeratedly. Thus, the relative frequency change at a temperature $T_1$ has a lower value $(\Delta f/f)_{1u}$ during the warm-up of the crystal than during the cooling off when the value is $(\Delta f/f)_{1o}$. This correspondingly applies to a higher temperature $T_2$. In FIG. 2, the temperature on reversal from heating up to cooling down is designated by $T_3$.

In FIG. 3, two aging curves for a single crystal are shown, namely, on the one hand, the curve exhibited by the crystal at a temperature $T_1$ and, on the other hand, the curve which would be exhibited by the crystal at a higher temperature $T_2$ (although the crystal can never exhibit more than a single temperature at a particular time t). In the semi-logarithmic illustration according to FIG. 3, two linear curve sections are obtained for each temperature. The first section extends from the time of production to two days after production. Crystals age very rapidly in this period. This is followed by much less aging which, however, occurs in accordance with the exp $(-k_d/T)$ law with increasing temperature. The timedependent change is logarithmic. Thus, the following holds true for the frequency response of aging:

$$\Delta f/f = k_c e^{-k_d/T} \ln t$$

where $k_c$ and $k_d$ are constants which must be individually determined for each oscillator.

The crystal oscillator compensation circuit 13 exhibits the previously mentioned crystal 12, a capacitance diode 14, an I/O port 15, a store (PROM) 16, a temperature sensor 17, a logic circuit 18 and a crystal oscillator circuit 19 with an automatic gain control (AGC) circuit 20.

Figure 4:
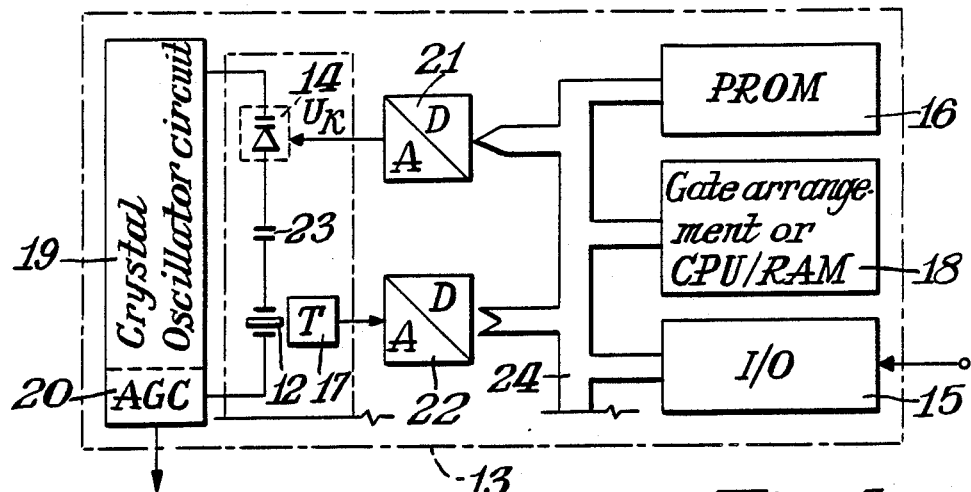
FIG. 4 is the block diagram of a crystal oscillator compensation circuit.
Figure 7:
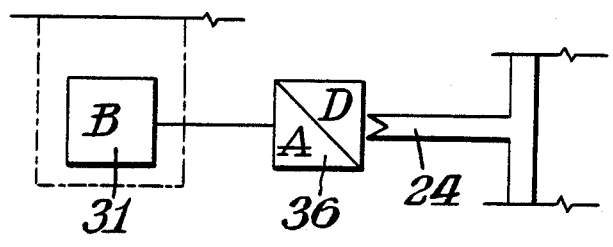
FIG. 7 is a diagrammatic block diagram for explaining the operation of an acceleration sensor.

The capacitance diode 14 and the crystal 12 are connected in series via a decoupling capacitor 23. The capacitance diode 14 is supplied by the DA converter 21 with an analog compensation voltage $U_K$. This corresponds to a digital value which is supplied to the D/A converter 21 via a bus 24 from the logic circuit 18. The logic circuit 18 calculates the said digital value on the basis of the above law for the temperature-dependent frequency response in dependence on the temperature signalled by the temperature sensor 17. Like the capacitance diode 14, this temperature sensor is also arranged in good thermal contact with the crystal 12 which is indicated by the dashed line enclosing the said components. The temperature sensor 17 supplies an analog signal to the analog/digital converter 22 which is forwarded by the latter, after conversion into a digital signal, to the logic circuit 18 via the bus 24. In FIG. 4 the bus is represented as being open towards the bottom in order to indicate that other components can also be connected to it. In particular, an aging compensation circuit is connected as functional means essential to the invention, which is explained in greater detail below with reference to FIG. 9. An acceleration compensation circuit can also be connected which is explained in greater detail below with reference to FIG. 7. It is essential that the aging compensation circuit is provided which is described below. The use of the previously explained temperature compensation circuit and/or of the acceleration compensation circuit still to be described are only advantageous further developments which are appropriate if the aging-compensated circuit is not protected against temperature changes and/or accelerations.

Figure 5:
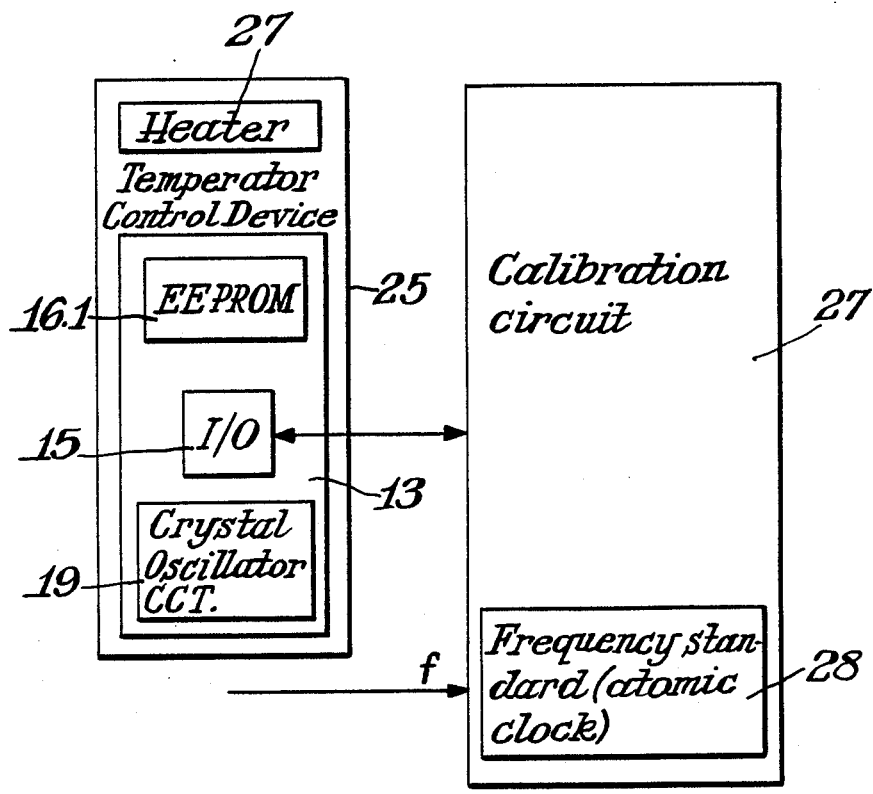
FIG. 5 is a diagrammatic block diagram for explaining the calibration process for the circuit according to FIG. 4.

The abovementioned equation constants $k_a$, $k_b$ and $T_o$ are stored in a manner which will now be explained in greater detail with reference to FIG. 5.

The crystal oscillator compensation circuit 13 described is arranged in a temperature control device 25 which is heated by a heater 26 to a temperature which is regulated by a calibration circuit 27. At the same time, the calibration circuit 27 monitors the signal from the temperature sensor 17 which is supplied to it via the I/O port 15. If the temperature signal remains unchanged for some time, which indicates that the temperature conditions are constant, the calibration circuit 27 measures frequency f which is output by the crystal oscillator circuit 19. This frequency is compared with the frequency of a frequency standard 28, for example an atomic clock. The frequency standard is set to a frequency at which the oscillator circuit 19 should also oscillate continuously. If a deviation of the frequencies is found, the calibration circuit changes the compensation voltage $U_K$ conducted to the capacitance diode 14, until there is correspondence of the frequencies. The signal for adjusting the compensation voltage is supplied to the crystal oscillator compensation circuit 13 via the I/O port 15.

This procedure is performed for several temperatures, during which the calibration circuit 27 stores for each temperature at which the calibration process occurs, the associated value for the signal for adjusting the compensation voltage. From, for example five measuring points within a temperature range of between −10 degrees Celsius and +60 degrees Celsius, the temperature-dependent characteristic numbers of the present crystal, that is to say the constants $k_a$, $k_b$ and $T_o$, can be very accurately say the determined. These constants are passed by the calibration circuit 27 via the I/O port 15 to the store which is no longer constructed as PROM 16 but as EEPROM 16.1 in the crystal oscillator compensation circuit 13 according to FIG. 5. Using an EEPROM has the advantage that constants can be changed again at a later time, for example if a recalibration is performed after a relatively long period. This is also possible if a NOVRAM is used instead of the PROM 16.

After this calibration process, the crystal oscillator compensation circuit 13 is disconnected from the calibration circuit 27 and is then available for use in a larger circuit which must be very accurately frequency stabilized. After the calibration, the crystal oscillator compensation circuit 13 operates in such a manner that, following a respective signal from the temperature sensor 17, the logic circuit 18, utilizing the values stored in the EEPROM 16.1, the law stored there and a program stored there, calculates the compensation voltage $U_K$ which must be supplied to the capacitance diode 14 in order to compensate for the frequency change effect caused by a temperature change with respect to an earlier time. Thus, the frequency f of the oscillator circuit 19 is continuously kept constant with a very high accuracy, namely an accuracy of about 10 ppb in an implemented illustrative embodiment.

In the preferred illustrative embodiment, the logic circuit 18 is formed by a CPU and a RAM. The CPU is operated with a frequency extracted from the frequency f and the crystal oscillator circuit 19. This saves a separate clock oscillator for the logic circuit.

Figure 6:
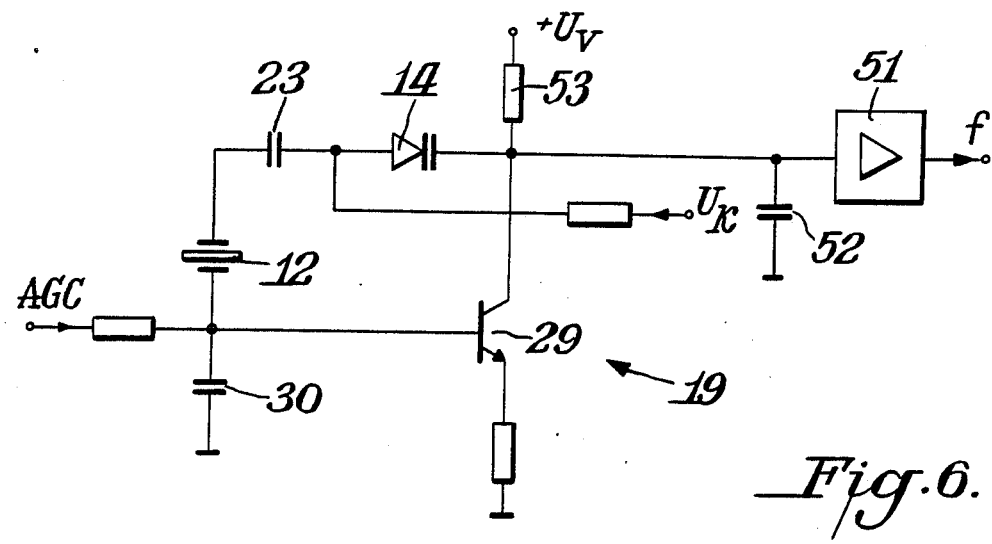
FIG. 6 is the circuit diagram for controlling a capacitance diode within an oscillator circuit which is a part of the circuit according to FIG. 4.

The drive for the capacitance diode 14 is shown in greater detail in the crystal oscillator circuit according to FIG. 6. The oscillator circuit has an oscillator transistor 29 and the emitter of which is earthed via a resistor. The base receives voltage from the AGC 20 with interposition of a capacitive voltage divider. The capacitive voltage divider exhibits, on the one hand, a capacitor 30 located between base and earth and, on the other hand, a capacitor arrangement consisting of the crystal 12, the decoupling capacitor 23 and the capacitance diode 14. The other terminal of the capacitance diode 14 is connected to the collector of the oscillator transistor 29 and via an inductance 53 to a voltage source for supplying a supply voltage $U_V$. Between the capacitance diode 14 and the decoupling capacitor 23, the connecting point for the control voltage for controlling the capacitance diode 14 and thus the frequency of resonance of the crystal oscillator 12 is located. The control voltage is the abovementioned compensation voltage $U_K$. This is obtained from the supply voltage $U_V$ on the basis of the abovementioned law with the aid of the abovementioned method.

Due to this arrangement, in which the capacitance diode 14 is arranged between the feed points for the largely temperature-dependent supply voltage $U_V$ and the compensation voltage $U_K$ derived from the latter, the influence of the temperature response of the oscillator transistor 29 on the frequency of resonance of the crystal 12 is eliminated. This ensures that the temperaturedependent frequency response of the crystal 12 can be accurately compensated in accordance with the above law.

The capacitance of the decoupling capacitor 23 (the decoupling relates to the direct voltage, the capacitor acts as a feedback for the alternating voltage occurring) is 30 pF, that of the capacitance diode is adjustable between about 15 and 300 pF. The decoupling capacitor 23 has a high Q.

The frequency signal f is picked up at the collector of the oscillator transistor 29 via an isolating amplifier 51 which ensures that load changes at the output do not have any effect on the oscillation behavior of the crystal oscillator circuit 19. The collector is also connected to an oscillating capacitor 52 to earth which, together with the inductance 53 also connected to the collector, forms a resonant LC circuit which is tuned to the required frequency f. This particularly advantageous circuit configuration leads to unwanted harmonics of the frequency f and also noise signals located outside the bandwidth of the resonant LC circuit being filtered out. As a result, the isolating amplifier 51 is only supplied with the signal of the required frequency f as a strong signal.

As mentioned, the oscillator transistor 29 receives a signal from the automatic gain control circuit AGC 20.

This is a conventional AGC for adjusting the power loss of the crystal oscillator 12. The crystal 12 is operated by the AGC 20 at a power at which there is no change in the oscillator characteristics compared with the non-oscillating state of the crystal. A typical power value is about 0.5 mW. If the crystal 12 were to be operated at high powers, the above constants would change in the law for the temperature-dependent frequency response. Other characteristic values of the crystal, for example in the law for the aging-dependent frequency response would change. Particularly with respect to the agingdependent frequency response, which will be discussed in greater detail below, it must be noted that there can be relatively long periods, possibly over the period of years, in which a crystal 12 is not operated whilst another crystal may under certain circumstances be continuously operated. If there were a difference in the constants for the cases of the oscillating and the non-oscillating state, these differences would also have to be taken into consideration in the calculation of compensation voltages which would be very expensive. It is therefore of particular advantage in a circuit according to the invention to limit the power loss as stated above.

Figure 8:
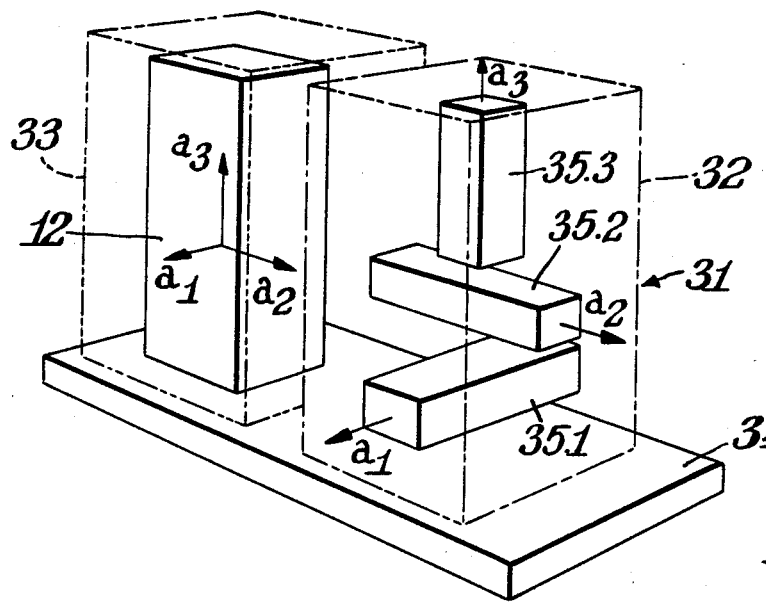
FIG. 8 is a diagrammatic perspective view for explaining the alignment of an acceleration sensor with respect to an oscillating crystal.
Figure 9:
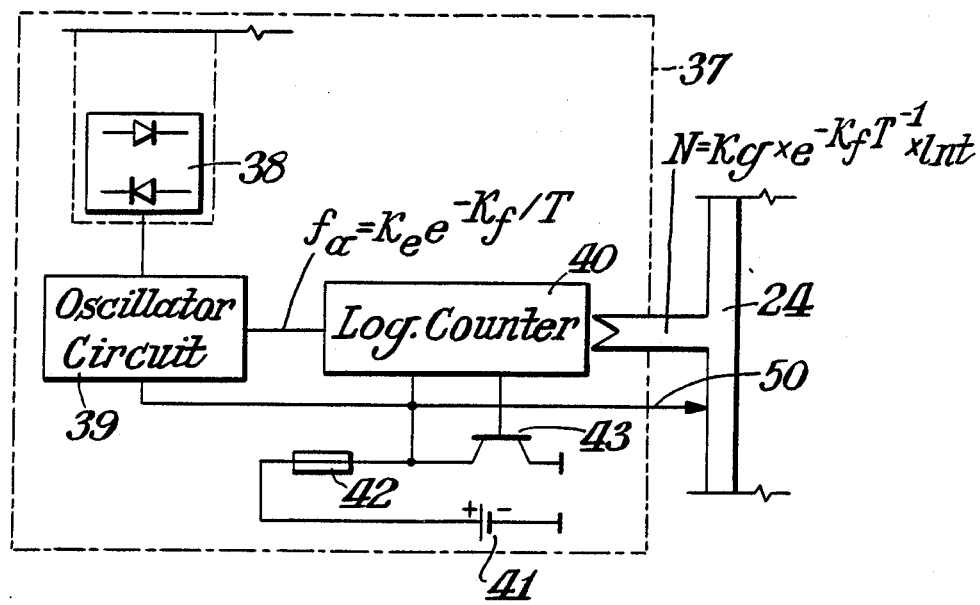
FIG. 9 are block diagrams of an aging circuit.

In the implementation of the preferred illustrative embodiment, it is not a D/A converter 21 and a separate A/D converter 22 which are used but the A/D converter is formed with the aid of the D/A converter, preferably by means of a circuit operating in accordance with the successive approximation method (one digit at a time). This also applies to the cases, described below, in which a measurement signal is supplied to an A/D converter. This is cheaper and saves more space than if a $separate A/D converter were used In the explanation of FIG. 4 above, it has already been mentioned that an acceleration sensor can also be connected to the bus 24. Such an embodiment will now be explained in greater detail with reference to FIGS. 7 and 8. According to FIG. 7, an acceleration sensor 31 is connected to the bus 24 via an A/D converter 36. The housing 32 of the acceleration sensor 31 is, as is diagrammatically shown in FIG. 8, mechanically rigidly connected to the housing 33 of the crystal 12 via a common base plate 34, for example a circuit board, so that the acceleration sensor 31 is subjected to the same direction and amount of acceleration as the crystal 12. FIG. 8 shows that the acceleration sensor 31 exhibits three sensor crystals 35.1 to 35.3 in three spatial directions which are at right angles to one another and which are designated by $a_1$, $a_2$ and $a_3$, respectively. The axes of these sensor crystals 35.1 to 35.3 are aligned with respect to the cube-shaped crystal 12 in such a manner that the said directions are parallel to the cube edges. These cube edged directions represent the directions in which the oscillator frequency responds with respect to acceleration changes. However, it must be noted that it depends on the direction of cut of the crystal 12 whether it is acceleration sensitive in all three edge directions or not. A crystal 12 which is cut exactly in AT direction is essentially only sensitive to acceleration in the longitudinal direction. If such a cut is used, the sensor crystals 35.1 and 35.2 can thus be omitted, the direction of which are parallel to the short edges of the crystal 12.

Instead of three sensor crystals 35.1 to 35.3, which are aligned in three spatial directions which are at right angles to one another, it is also possible to use only a single sensor crystal which shows a measurement effect with respect to accelerations in all three spatial directions.

The acceleration sensor 31 emits via an analog/ digital converter 36 an acceleration signal to the bus 24. This acceleration signal is processed like the temperature signal by the temperature sensor 17. That is to say that the crystal oscillator compensation circuit 13 is firstly calibrated for various accelerations which is done by arranging the crystal oscillator compensation circuit 13 on an oscillating table which is operated at various frequencies. The calibrating circuit 27 then performs measurements at various frequencies of vibration and, in turn, emits a compensation voltage until there is no difference between the frequency from the oscillator circuit 19 and the frequency of the frequency standard 28 in spite of the acceleration effects. Characteristic values determined with this calibration procedure are stored in EEPROM 16.1. Once the crystal oscillator compensation circuit 13 is calibrated with respect to changes in acceleration in this manner, frequency shift effects due to acceleration changes will be compensated in later operation correspondingly to the compensation with respect to temperature effects as described above. The aging compensation which is described for the subjectmatter of the application, will now be described with reference to FIGS. 9 and 10. For this aging compensation, an aging circuit 37 is provided which exhibits a temperaturesensitive component 38, an oscillator circuit 39, a logarithmic counter 40, a battery 41, a microfuse 42 and a shortcircuit transistor 43.

The temperature-sensitive component 38 acts on the oscillator circuit 39 in such a manner that it outputs a frequency $f_a$ which satisfies the following equation: $f_a = k_e e^{-k_f/T}$, where $k_e$ and $k_f$ are constants which are proportional to the constants $k_c$ and $k_d$ of the equation explained with reference to FIG. 3. The logarithmic counter 40 counts the cycles from the oscillator circuit 39 in such a manner that its count N does not increase proportionally with the number of cycles at its input but only logarithmetically with the number of input cycles. Thus, however, the count also only increases logarithmetically and not linearly with time t so that the following holds true for the count N:

$$N = k_g e^{-k_f/T} \ln t$$

where the constant $k_g$ is proportional to the constant $k_c$ which relates to the equation explained with reference to FIG. 3 concerning the age-dependence of the frequency response.

The count N is supplied to the logic circuit 18 (not shown in FIG. 9) via the bus 24. This circuit calculates on the basis of the characteristic numbers stored in the EEPROM 16.1 an aging compensation signal which is supplied to the capacitance diode 14. In this arrangement, the logic circuit changes the aging compensation signal between a first time and a second time by such an amount that the influence for shifting the frequency of the oscillator due to this just cancels the influence for opposite shifting due to the aging between the two times.

The characteristic numbers for calculating the aging compensation signal are again determined by means of a calibration process which corresponds to the calibration process for determining the characteristic numbers for the temperature dependence of the frequency response. Thus, the frequency f emitted by the oscillator circuit 19 is changed at a first time by emitting a signal from the calibration circuit 27 to the I/O port 15 until it corresponds to the frequency of the frequency standard 28. The same process is repeated for several further times and the characteristic values are calculated from the compensation signals required in each case.

Figure 10:
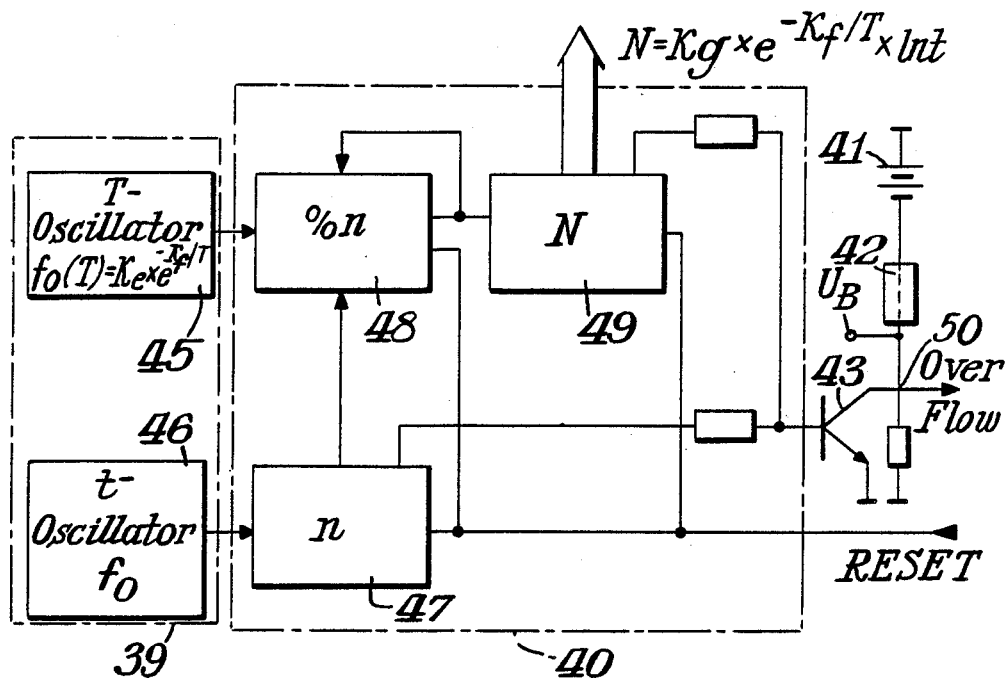
FIG. 10 is the circuit diagram of an aging circuit according to the block diagram of FIG. 9.
Figures 11A, 11B:
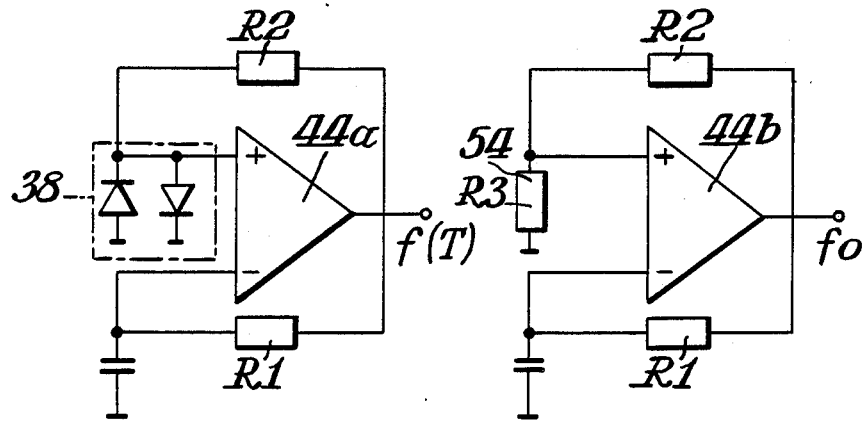
FIGS. 11a,b are circuit diagrams of the oscillators in the circuit diagram according to FIG. 10 for determining the temperature dependence or the time sequence.

FIG. 10 will now be used for explaining the configuration of the aging circuit 37 in greater detail. The oscillator circuit 39 exhibits two oscillators, namely an oscillator 45, called T oscillator, for determining the temperature dependence of the aging and an oscillator 46, called t oscillator for measuring the time elapsed since the starting of the aging circuit. The T oscillator 45 is configured as shown in FIG. 11a. It has a feedbacktype operational amplifier 44a at one input of which the temperature-sensitive component 38 is located in the form of two oppositely connected diodes. The t oscillator 46 is correspondingly configured with a feedback-type operational amplifier 44b at one input of which a resistor 54 is located instead of the diodes.

The logarithmic counter 40 has a first counter which is called time counter 47 in the text which follows, a presetable counter 48 and a second counter which is called aging counter 49 in the text which follows. The time counter counts the pulses supplied to it by the t oscillator 46. The presetable counter 48 counts the pulses supplied to it by the T oscillator 45, counting down from a preset value. As soon as it has reached the count zero, it forwards a pulse to the aging counter 49. At the same time, it is set to a new value which is the current count of the time counter 47.

To explain the operation of the aging circuit configured in this manner, it is initially assumed that the temperature is constant and both the time counter 47 and the presetable counter 48 are set at an initial time via a reset input to a predetermined value which enables the circuit to start, for example to the value 2. It is further assumed that both oscillators 45 and 46 oscillate at the safe frequency at the assumed constant temperature. The consequence of this is that, when the presetable counter 48 has counted down to zero from the initial value 2, the time counter 47 has counted up from 2 to 4. The presetable counter 48 now emits a first pulse to the aging counter 49 and, at the same time, it is set to the count of the time counter 47, that is to say the value 4. As soon as it has counted down again to 0, it emits a second pulse to the aging counter 49 and, at the same time, is preset to the current count of the time counter 47, now the value 8. The same game is then repeated again and again, the time intervals between two successive pulses from the presetable counter 48 to the aging counter 49 increasing linearly with time. This linear increase in the intervals with the time means an increase in the count of the aging counter 49 which is proportional to the logarithm of the time elapsed since the time of the starting of the circuit.

In the next step, it is assumed that the temperature at the diodes 48 increases compared with the initially assumed value at which the two oscillators 45 and 46 oscillate at the same frequency. The frequency of the T oscillator 45 then increases in accordance with the abovementioned exponential law. The presetable counter 48 then counts down more quickly than the time counter 47 counts up. As a result, a pulse reaches the aging counter 48 after a preceding pulse earlier than this was the case at a lower temperature, in accordance with the exponential dependence of the frequency of the T oscillator 45 on the temperature. The count of the aging counter 49 thus increases proportionally to the product of the logarithm of the time elapsed since the starting of the circuit and the negative reciprocal value of the temperature corresponding to the aging of the oscillating crystal monitored.

As already explained above, the T oscillator 45 and the t oscillator 46 are essentially of the same configuration. The consequence of this is that aging effects of these two oscillator circuits 45 and 46 cancel each other in the logarithmic counter 40. In addition, this makes it possible to compensate higher-order temperature effects at the two oscillators and these two are brought into good thermal contact with the oscillating crystal monitored. The only effects not compensated are the effects of components deviating from one another, that is to say the highly dependent temperature behavior of the diodes 38 is not compensated by the weakly temperature-dependent behavior of the resistor 54. However, this is exactly the purpose of the arrangement, namely only to utilize the temperature-dependence of the diode characteristics, uninfluenced by temperature-dependent characteristics of the other circuit components, for simulating the temperaturedependent characteristic of the oscillating crystal monitored.

As has already been explained above, the equation describing the aging behavior of an oscillating crystal L 5 includes a coefficient $k_g$ to be determined for each individual oscillating crystal. A corresponding coefficient must be determined for the aging circuit by means of calibration.

With an optimum design of the circuit, first the time counter will overflow at a low operating temperature of the oscillating crystal monitored, and the aging counter with continuing high temperature. After an overflow of one of these two counters, the aging counter 49 would emit a signal which would be faulty with respect to the required simulation of the aging dependence of the crystal characteristics. To avoid this, the overflow outputs of the two counters are connected to the base of a shortcircuit transistor 43 which, when the overflow signal is applied to it, short circuits a fuse 42 to the battery 41 so that the fuse burns through. This is determined via a signal line 50 and the signal emitted via this line ensures that the compensation circuit stops at the last value determined for the aging characteristics. In addition, the fuse disconnects the operating voltage UB from the active components of the aging circuit.

In a practical illustrative embodiment, dividers were arranged in front of the time counter 47 and the aging counter 49 in order to manage with 12-bit counters despite relatively high frequencies of oscillation of the oscillators 45 and 46. The frequency, the divider ratios and the counter capacities are matched to one another in such a manner that the time counter 47 overflows after about 10 years. The aging counter 49 overflows after about 7 years at 80 degrees Celsius continuous operating temperature and after about 7 years at 40 degrees Celsius continuous operating temperature. A Li battery is suitably used as battery 41 which exhibits a distinctly higher life than $2\frac{1}{2}$ years with continuous operation of the aging circuit 37, so that it is ensured that the aging circuit is operated in the intended manner until the changed signal occurs on the signal line 50. Even a very small battery with about 2 Ah has an adequate life of, for example, five years since the aging circuit 37 specified exhibits a current consumption of only about 5 $\mu$A.

It must be noted that after about $2\frac{1}{2}$ years have elapsed, aging-related frequency changes are only very slight in crystal oscillators 12. The logic circuit 18 then continuously assumes the highest count of the aging counter 49 in the calculation of the aging compensation signal since the signal no longer assumes a high level on the signal line 50. In principle, the overflow value of the LN counter 40 and the life of the battery 41 are designed in such a manner that the residual aging after the burning through of the fuse 42 is negligible for the respective specification. In special cases, a new fuse can be inserted and the circuit 13 can be recalibrated.

In the illustrative embodiments described, a crystal oscillator with AT cut was used as a reference. However, the invention is applicable to any oscillator crystal independently of the material used and independently of the cutting angle used.

In addition, the invention can be used not only for any oscillator crystal but also any other component or in circuits, provided that the aging behaviour is proportional to the logarithm of time and an exponential function, with the negative reciprocal value of the temperature as exponent. This virtually applies to all components having a crystalline structure and for circuits the characteristics of which are significantly determined by such components.

The frequency of a crystal oscillator can be controlled within certain limits by changing a reactive impedance. In practice, only control with the aid of adjustable capacitances, particularly with capacitance diodes has hitherto been useful which is why only such a control system was referred to. In the illustrative embodiments, the capacitance diode is in series with the crystal. However, it is also possible to arrange the diode in parallel with the crystal which, in practice, however, can only be implemented with little expenditure if a crystal oscillator is excited in its fundamental frequency. However, the series circuit has also been found to be more suitable for this case.

In the preferred illustrative embodiment, the store for storing the characteristic crystal oscillator numbers is an EEPROM or a NOVRAM which, as described, has the advantage that new characteristic numbers can be entered in a simple manner during a recalibration process. If a recalibration can be omitted, it is sufficient to use a ROM which can be programmed only once, for example an EPROM. Apart from the electrically programmable stores, those which can be programmed by other means, for example optical means, can also be used which have been recently developed in research.

In the illustrative embodiments, the logic circuit 18 is formed by a CPU and a RAM. However, it is also possible to perform the calculations by means of a gate arrangement. In this connection, there are two possibilities. One of these is that the gate arrangement is configured in such a manner that it calculates compensation signals accurately in accordance with the previously known law, taking into consideration the stored characteristic numbers and the measured temperature, a measured acceleration or a measured time sequence. The other possibility is that detailed tables are set up during calibration in PROM 16 in which a large number of temperatures is in each case associated with a temperature compensation signal and a large number of times is in each case associated with an aging compensation signal which can also be done correspondingly for accelerations or other influencing variables. The gate arrangement is then only used for addressing the PROM in dependence on, for example a measured temperature and, to calculate the accurate voltage value of the signal on the basis of the table value for the compensation signal looked up. However, such a configuration requires a very elaborate calibrating process.

If an aging circuit with a counter is used, instead of a microfuse 42 any other storage device can also be used which records the occurrence of the overflow signal. For example, the entire crystal oscillator compensation circuit 13 can be switched on for a short time when the overflow signal occurs, namely until the fact of the overflow is stored in a storage location of the EEPROM 16.1.

In accordance with the programme stored in the store 16, second-order effects can also be taken into consideration, for example the hysteresis effect explained with reference to FIG. 2. Another possibility consists of taking into consideration a temperature dependence of the frequency response due to acceleration.

It is of particular advantage to construct the circuit according to the invention in SMD (surface mounted device) technology since this provides a volume of only a few ccm, that is to say less by orders of magnitude than in the case of conventional crystal oscillators with very good compensation. If the circuit is plotted with a resin of good thermal conduction, it is ensured that all components have the temperature measured by the temperature sensor.

I claim:
1. Crystal oscillator compensation circuit comprising
   (a) an oscillator crystal which is excited into oscillation by a crystal oscillator circuit, and
   (b) an adjustable capacitance for adjusting the frequency of the crystal, characterized by
   (c) a port (15) for connecting a measuring instrument (27) for measuring characteristics of the crystal (12),
   (d) a store (16; 16.1) for storing characteristic numbers of the crystal calculated from the measurement data
   (e) a logic circuit (18), and
   (f) an aging circuit (37), which emits an aging signal to the logic circuit (18) by means of a count (N) from a counter (40) and, for this purpose, contains an oscillator circuit (39) which exhibits at least one component (38) which is temperature-dependent in its characteristics and which is connected in such a manner that the elementary frequency of the oscillator counted by the counter (40) changes with the temperature in accordance with the law $f = K_e \times e^{-k_f/T}$,
   in which arrangement $k_e$ and $k_f$ are constants which are individually determined for each oscillator, and
   in which arrangement the logic circuit emits, in dependence on the respective aging signal, an aging compensation signal to the adjustable capacitance (14) which is changed between a first time (t1) and a second time (t2) in accordance with a known law and taking into consideration the stored characteristic numbers, by such an amount that the resultant influence for shifting the oscillator frequency (f) just cancels the influence for the opposite shift due to the aging between the two times.

2. Circuit according to claim 1, characterized in that the counter in the aging circuit (37) is a logarithmic counter (40).

3. Circuit according to claim 1, characterized by a storage device (42), which is connected to the counter (40) and stores overflow information when the counter emits an overflow signal.

4. Circuit according to claim 3, characterized in that the storage device is a microfuse (42) which burns through when it receives the overflow signal.

5. Circuit according to claim 1, characterized by
  a temperature sensor (17), which is arranged in such a manner that it always exhibits, if possible, the same temperature as the crystal,
  in which arrangement the logic circuit (18) is supplied with the temperature signal from the temperature sensor and emits, in dependence on the respective temperature signal a temperature compensation signal ($U_K$) to the adjustable capacitance (14), and
  in which arrangement, with a temperature change from a first temperature ($T_1$) to a second temperature ($T_2$), the temperature compensation signal is changed by the logic circuit in accordance with a known law and taking into consideration the stored characteristic numbers, by such an amount that the resultant influence for shifting the oscillator frequency (f) just cancels the influence for the opposite shift due to the temperature change.

6. Circuit according to claim 5, characterized in that the logic circuit (18) takes into consideration the hysteresis effect of the temperature/frequency change behavior.

7. Circuit according to claim 1, characterized by
  an acceleration sensor (31) which emits an acceleration signal to the logic circuit (18), and
  in which arrangement the logic circuit emits an acceleration compensation signal to the adjustable capacitance (14) in dependence on the respective acceleration signal, and
  in which arrangement, with a change in acceleration from a first acceleration to a second acceleration, the acceleration compensation signal is changed by the logic circuit in accordance with a known law and taking into consideration the stored characteristic numbers, by such an amount that the resultant influence for shifting the oscillator frequency (f) just cancels the influence for the opposite shift due to the change in acceleration.

8. Circuit according to claim 1, characterized by an automatic gain control circuit (20) within the crystal oscillator circuit (19), which operates the crystal (12) at such a power at which there is no change in the oscillator characteristics compared with the nonoscillating state of the crystal.

9. Circuit according to claim 1, characterized in that the crystal oscillator circuit (19) exhibits an oscillator transistor (29), between the base and collector of which the crystal (12), a decoupling capacitor (23) and the capacitance diode (14) are connected in the said order, that in this arrangement the supply voltage ($U_V$) is present at the collector and the compensation control voltage ($U_K$), which is obtained from the supply voltage, for the capacitance diode is supplied between the latter and the decoupling capacitor.

10. Circuit according to claim 9, characterized in that the collector of the oscillator transistor (29) is connected to an oscillating capacitor (52) and an inductance (53) which form a resonant LC circuit which is tuned to the required frequency (f) of the crystal oscillator circuit (19).

* * * * *